United States Patent [19]

Yamashita

[11] Patent Number: 4,860,120
[45] Date of Patent: Aug. 22, 1989

[54] LOW-FREQUENCY CONVERTER FOR CARRIER CHROMINANCE SIGNAL

[75] Inventor: Hiromitsu Yamashita, Itami, Japan

[73] Assignee: Mitsubishi Denki Kabushiki Kaisha, Tokyo, Japan

[21] Appl. No.: 202,564

[22] Filed: Jun. 6, 1988

[30] Foreign Application Priority Data

Nov. 2, 1987 [JP] Japan ................................ 62-277965

[51] Int. Cl.⁴ ......................... H04N 9/79; H04N 9/45
[52] U.S. Cl. .................................... 358/330; 358/328; 358/19
[58] Field of Search ................. 358/326, 328, 330, 19, 358/31, 40

[56] References Cited

U.S. PATENT DOCUMENTS

| | | | |
|---|---|---|---|
| 3,704,341 | 11/1972 | Fujita | 358/326 |
| 3,730,983 | 5/1973 | Numakura et al. | 358/328 |
| 3,821,788 | 6/1974 | Kobayashi | 358/19 |
| 3,968,514 | 7/1976 | Narahara et al. | 358/330 |
| 4,405,937 | 9/1983 | Kudo et al. | 358/19 |
| 4,503,455 | 3/1985 | Oshora | 358/19 |
| 4,709,256 | 11/1987 | Lechner et al. | 358/19 |

FOREIGN PATENT DOCUMENTS 5725116 4/1978 Japan.
539928 5/1982 Japan.

OTHER PUBLICATIONS

Monthly Magazine "Television Technics", published by Denshigijutsu Shuppansha, Jun. 1984, pp. 57–61.
"New Chrominance Signal Processing LSI for Home VCR", IEEE Transactions on Consumer Electronics, vol. CE-26, Aug. 1980, pp. 315–321.
"Advanced and Simplified Signal Processing System for VTR and its high performance LSI's", IEEE Transactions on Consumer Electronics, vol. CE-24, No. 3, Aug. 1987, pp. 458–467.
"Video Cassette Recorder Development for Consumers", IEEE Transactions on Consumer Electronics, vol. CE-24, No. 3, Aug. 1987, pp. 468–472.

Primary Examiner—Aristotelis M. Psitos
Assistant Examiner—W. Daniel Swayze, Jr.
Attorney, Agent, or Firm—Oblon, Spivak, McClelland, Maier & Neustadt

[57] ABSTRACT

A first PLL circuit receives a color burst signal of a carrier chrominance signal and outputs a first continuous wave signal which is identical in frequency and phase to the color burst signal. The first continuous wave signal is frequency converted by a first frequency divider and a second PLL circuit into a second continuous wave signal having a frequency of the sum of or difference between frequencies of the carrier chrominance signal and a derived low-frequency conversion chrominance signal. A multiplier multiplies the carrier chrominance signal by the second continuous wave signal. An output signal from the multiplier is supplied to an extraction circuit to obtain the low-frequency conversion chrominance signal.

10 Claims, 6 Drawing Sheets

LOW-FREQUENCY CONVERTER FOR CARRIER CHROMINANCE SIGNAL

BACKGROUND OF THE INVENTION

1. Field of the Invention

The present invention relates to a frequency converter for performing low-frequency conversion of a carrier chrominance signal, in order to record a color video signal on a magnetic tape or the like.

2. Description of the Background Art

FIG. 1 is a block diagram showing a conventional low-frequency converter for a carrier chrominance signal, which is employed in a video tape recorder. Such a structure is disclosed in the MITSUBISHI DENKI TECHNICAL REPORT Vol.60, No.7, 1986, pp.64–66, for example. Referring to FIG. 1, a carrier chrominance signal having a color subcarrier frequency $f_{sc}$ is received at input 1 and another input 2 receives a signal which is synchronous with a horizontal synchronizing signal having horizontal synchronizing frequency $f_H$, such as a signal obtained by triggering a one-shot multivibrator by the horizontal synchronizing signal.

The carrier chrominance signal is supplied to a switching circuit 3 generally called a burst gate. The Burst gate 3 is opened only in a color burst signal period so that a color burst signal is extracted from the carrier chrominance signal to be supplied to a multiplier 5 of a phase-locked-loop (hereinafter referred to as PLL) circuit 4. The multiplier 5 multiplies the supplied color burst signal by an output signal from a voltage control oscillator (hereinafter referred to as VCO) 6 in order to perform phase detection. Only a low-frequency component of the phase detection output is supplied to a control input of the VCO 6 through a low-pass filter (hereinafter preferred to as LPF) 7. Thus, the output signal of the VCO 6 is stabilized at the same frequency and phase with the color burst signal. This loop of the PLL circuit 4 is called an APC (automatic phase control) loop.

A signal, which is synchronous with the horizontal synchronizing signal, received through the input terminal 2 is supplied to a multiplier 9 of another PLL circuit 8. The multiplier 9 multiplies the signal, which is synchronous with the horizontal synchronizing signal, by a signal obtained through frequency division of an output signal from a VCO 10 by a frequency divider 11, in order to perform phase detection. Only a low-frequency component of the phase detection output is supplied to a control input of the VCO 10 through an LPF 12. When the carrier chrominance signal is in the NTSC (National Television System Committee) system and the video tape recorder is in the VHS recording system, the divisional ratio of the frequency divider 11 is selected at 1/320, for example. In this case, the output signal from the VCO 10 is stabilized in the same phase with the horizontal synchronizing signal at a frequency of 320 $f_H$. This loop of the PLL circuit 8 is called an AFC (automatic frequency control) loop.

The output signal from the VCO 10 is frequency-divided by a frequency divider 13. The divisional ratio of the frequency divider 13 is selected at ⅛, for example, so that a signal having a frequency of 40 $f_H$ is obtained at its output. The frequency divider 13 also serves as a phase transition switching circuit in the VHS system, to rotate the phase of an output signal by 90° for each horizontal synchronizing period and reverse the direction of phase rotation field by field. Such processing, generally called PS (phase shift) processing, is for preventing crosstalk from an adjacent track. PI (phase invert) processing is performed in the case of the beta system.

The output signals from the VCO 6 and the frequency divider 13 are inputted in a multiplier 14, which is called sub-balanced modulator. The multiplier 14 multiplies the two signals having the frequencies of $f_{SC}$ and 40 $f_H$, respectively, by each other, to output a signal including two frequency components of $f_{SC} \pm 40f_H$. Within this signal, only the frequency component of $f_{SC} + 40f_H$ is extracted by a bandpass filter (hereinafter referred to as BPF) 15, to be inputted in a multiplier 16 called a main balanced modulator.

The multiplier 16 also receives the carrier chrominance signal which is supplied to the input 1. The multiplier 16 multiplies the two input signals having the frequencies of $f_{SC}$ and $f_{SC} + 40f_H$ by each other, to output a signal including two frequency components of $f_{SC} \pm (f_{SC} + 40f_H)$. Within this signal, only the frequency component of $40f_H$ is extracted by an LPF 17. Thus, a low-frequency conversion chrominance signal in the VHS system is obtained. This low-frequency conversion chrominance signal is supplied to a recording head 18 of the video tape recording in superposition with a luminance signal as is well known.

When the carrier chrominance signal supplied to the input 1 includes jitter during dubbing, such jitter is also included in the color burst signal extracted from the burst gate 3 and the signal which is synchronous with the horizontal synchronizing signal supplied to the input 2. Hence the jitter of the carrier chrominance signal is cancelled in the multiplier 16, by the jitter in the output signal from the BPF 15.

The conventional low-frequency converter for a carrier chrominance signal as hereinabove described has the following disadvantages:

(i) The structure is complicated with a large number of components, so that the size of the circuit is inevitably increased.

(ii) A large number of spurious components are contained in the output signal of the multiplier 14, which is the sub-balanced modulator. These spurious components are mainly frequency components of the sum of or the difference between the output signal from the VCO 6 and a spurious component in the signal having the frequency of 40 $f_H$ outputted as the result of multiplication of the signal which is synchronous with the horizontal synchronizing signal by the PLL circuit 8 and frequency division of the synchronous signal by the frequency divider 13. Such spurious components cannot be sufficiently removed by the BPF 15, and hence unwanted components, which create noise, are generated in the output from the multiplier 16.

FIG. 2 is a frequency spectrum diagram of signals in the low-frequency converter shown in FIG. 1, wherein symbols B1 and B2 denote bands of BPF 15 and LPF 17, respectively. The output signal from the multiplier 14 includes spurious components in the vicinity of the frequency $f_{SC} + 40f_H$, which are caused by a sixfold component of the signal having the frequency $40f_H$. That is $40f_H \times 6 - 3.58\ MHz = 3.77\ MHz - 3.58\ MHz = 194\ KHz$ and the spurious components 4.21 MHz±194 KHz and 4.21 MHz±2×194 KHz etc.

result from intermodulation of the components 194 KHz and 4.21 MHz ($f_{SC}+40f_H$). This spurious components are converted into a low-frequency range and remain in the output signal of the LPF 17 as frequency component 629 KHz±194 KHz and 629 KHz±2×194 KHz etc.

where 629 KHz is equal to $40f_H$. This frequency componets cause color noise during reproducing so that picture quality is deteriorated.

SUMMARY OF THE INVENTION

A low-frequency converter for a carrier chrominance signal according to the present invention includes a device for extracting a color burst signal from a carrier chrominance signal, a first PLL circuit which is phase-locked to the extracted color burst signal to output a first continuous wave signal having a frequency integral times that of the color burst signal, a frequency converter including at least a first frequency divider for frequency-dividing the first continuous wave signal, for frequency-converting the first continuous wave signal to output a second continuous wave signal having a frequency of the sum of or difference between the frequencies of the carrier chrominance signal and a low-frequency conversion chrominance signal. A multiplier multiplies the carrier chrominance signal by the second continuous wave signal and the low-frequency conversion chrominance signal is extracted from an output signal of the multiplier.

The multiplier employed in the present invention receives a signal created by the first PLL circuit and the frequency converter as well as the carrier chrominance signal to generate a low-frequency conversion chrominance signal, to enable elimination of the multiplier serving as a sub-balanced modulator and a BPF (band pass filter) for filtering an output signal of the multiplier. Each of these intems were required in prior art configurations.

Accordingly, an object of the present invention is to provide a low-frequency converter for a carrier chrominance signal, which can reduce its circuit scale without generating an unwanted spurious component and which can sufficiently cancel jitter of an input carrier chrominance signal.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
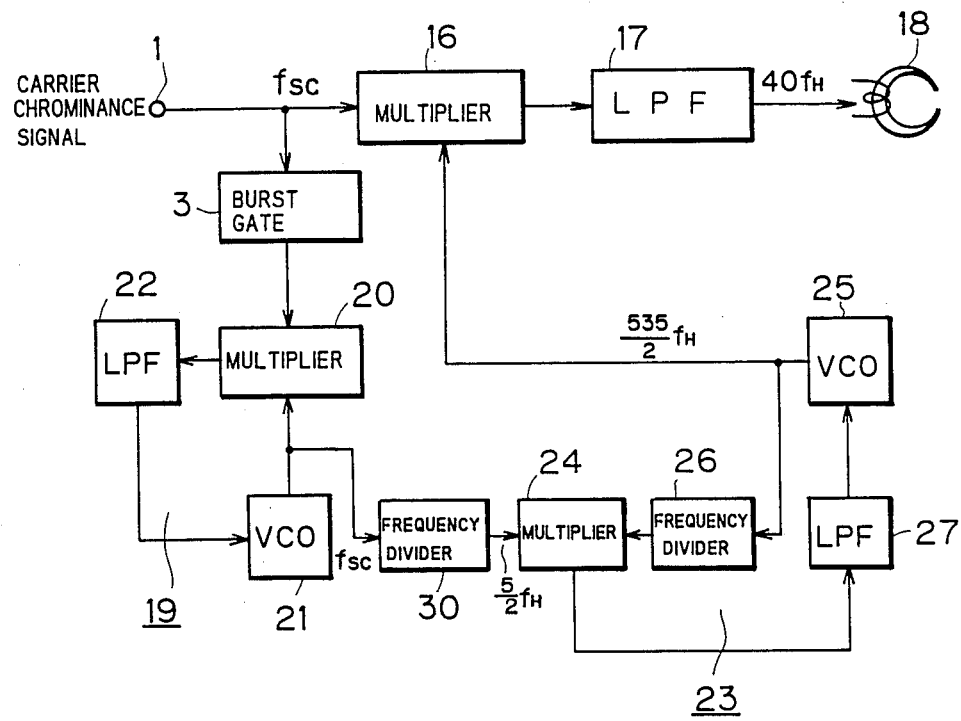
FIG. 3 is a block diagram showing an embodiment of a low-frequency converter for a carrier chrominance signal according to the present invention.

FIG. 3 is a block diagram showing an embodiment of a low-frequency converter for a carrier chrominance signal according to the present invention. Referring to FIG. 3, a carrier chrominance signal received in an input 1 is supplied to a burst gate 3. The burst gate 3 is opened only in a color burst signal period, whereby a color burst signal is extracted from the carrier chrominance signal to be supplied to a multiplier 20 of a first PLL circuit 19. The multiplier 20 multiplies the supplied color burst signal by an output signal of a VCO 21 to perform phase detection. Only a low-frequency component of the phase detection output is supplied to a control input of the VCO 21 through an LPF 22. Thus, the output signal from the VCO 21 is stabilized in the same frequency fhd SC and phase with the color burst signal. Thus, a color burst signal of continuous wave is obtained.

The output signal from the VCO 21 is subjected to frequency division by a first frequency divider 30. Assuming that the divisional ratio of the first frequency divider 30 is selected at 1/91, the output signal from the first frequency divider 30 has the frequency of:

$$(455/2)f_H \times (1/91) = (5/2)f_H \tag{1}$$

because the relationship between a color subcarrier frequency $f_{SC}$ and a horizontal synchronizing frequency $f_H$ in the NTSC system is:

$$f_{SC}=(455/2)f_H \tag{2}$$

The output signal from the first frequency divider 30 is supplied to a multiplier 24 of a second PLL circuit 23. The multiplier 24 multiples the output signal of the first frequency divider 30 by a signal obtained by frequency-dividing an output signal from a VCO 25 by a frequency divider 26, to perform phase detection. Only a low-frequency component of the phase detection output is supplied to a control input of the VCO 25 through an LPF 27. Assuming that the divisional ratio of the frequency divider 26 is selected at 1/107, the output signal from the VCO 25 has the frequency of:

$$(5/2)f_H \times 107 = (535/2)f_H \tag{3}$$

Since the second PLL circuit 23 is phase-locked to the output signal from the first frequency divider 30, the outer signal of the VCO 25 is in phase with the color burst signal. The following transformation can be made by utilizing the relation of the expression (1):

$$\begin{aligned}(535/2)f_H &= (455/2)f_H + 40f_H \\ &= f_{SC} + 40f_H\end{aligned} \tag{4}$$

A multiplier 16, being a main balanced modulator, receives the carrier chrominance signal supplied to the input 1 and the output signal from the VCO 25. The multiplier 16 multiples the two input signals having frequencies of $f_{SC}$ and $f_{SC}+40f_H$ respectively by each other to output a signal including two frequency components of $f_{SC}\pm(f_{SC}+40f_H)$. Within this signal, only the frequency component of $40 f_H$ is extracted by an LPF 17, so that a low-frequency conversion chrominance signal in the VHS system is obtained. The low-frequency conversion chrominance signal is supplied to a recording head 18 of a video tape recorder in superposition with a luminance signal.

When a carrier chrominance signal supplied to the input 1 includes jitter in the dubbing operation, such jitter is also included in a color burst signal extracted from the burst gate 3. Therefore, the output from the VCO 21 of the first PLL circuit 19 includes the jitter, and hence the output from the VCO 25 of the second PLL circuit 23 also includes the jitter, so that the jitter is cancelled in the multiplier 16, which is the main balanced modulator, similarly to the conventional case.

Figure 1:
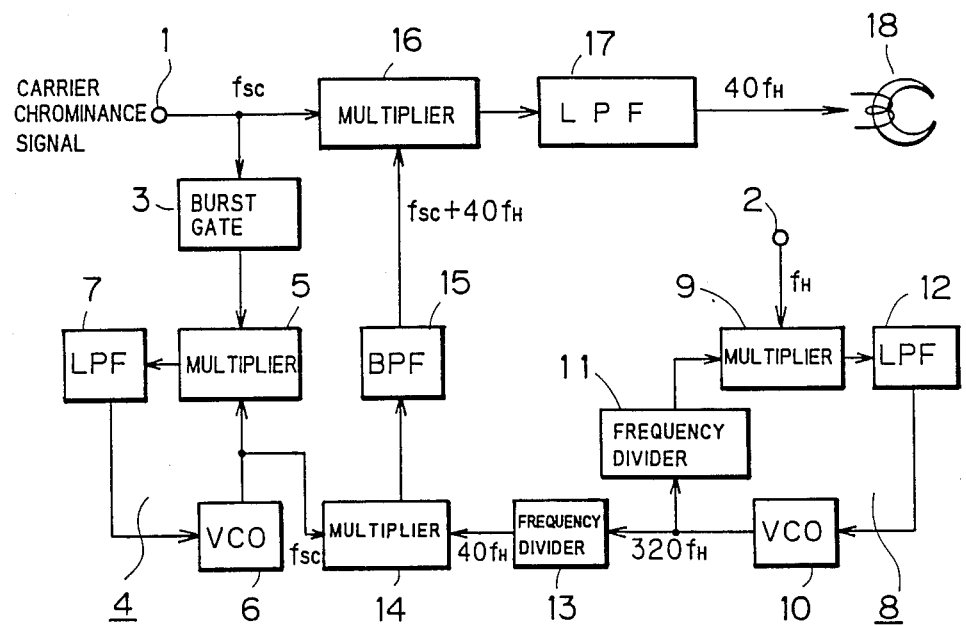
FIG. 1 is a block diagram showing a conventional low-frequency converter for a carrier chrominance signal.
Figure 2:
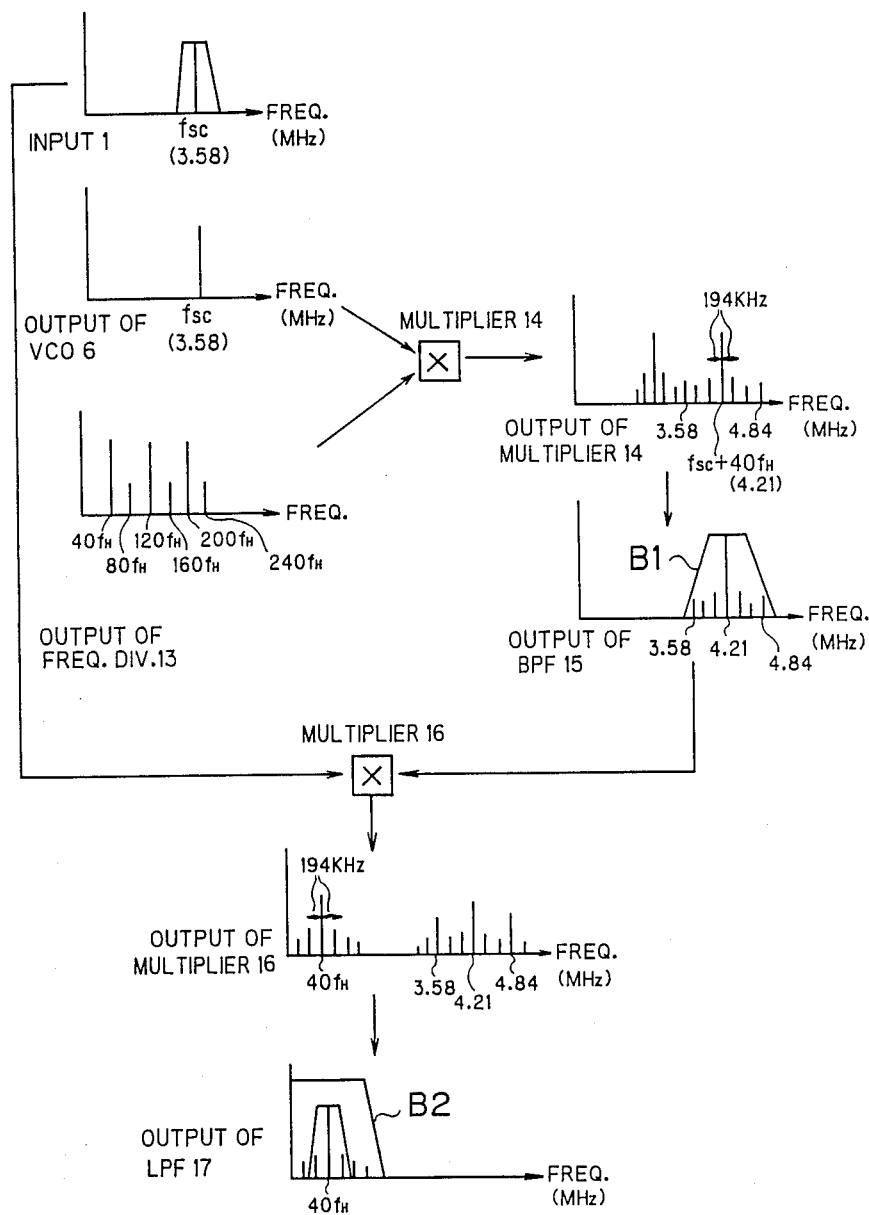
FIG. 2 is a frequency spectrum diagram of signals in the low-frequency converter shown in FIG. 1.

The above described embodiment has the following advantages:

(i) The multiplier 14, being the sub-balanced modulator and the BPF 15 in the conventional converter illustrated in FIG. 1 can be omitted. Therefore, the structure becomes simple and the number of parts and the circuit scale can be reduced. In a practical use, 500 elements, four external parts and five pins of an integrated circuit was reduced, so that the cost of a video tape recorder was greatly lowered.

(ii) The output signal of the VCO 25 only includes small unwanted spurious components. Such spurious small unwanted components are an integral times the frequency of $(535/2)f_H$ of the output signal, i.e., relatively high frequency components, and hence their influence can be completely removed by the LPF 17. Thus, the low-frequency conversion chrominance signal has an excellent signal-to-noise ratio.

Figure 4:
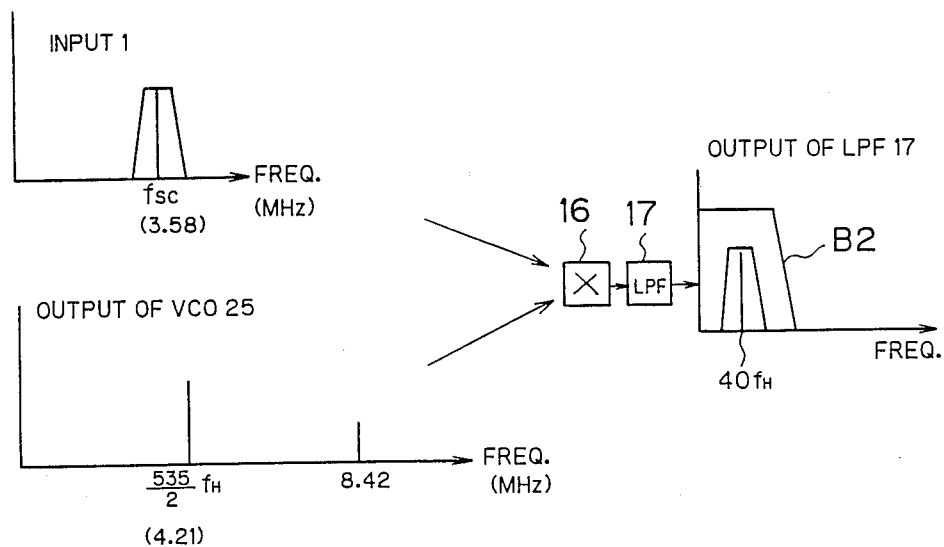
FIG. 4 is a frequency spectrum diagram of signals in the low-frequency converter shown in FIG. 3.

FIG. 4 is a frequency spectrum diagram of signals in the low-frequency converter shown in FIG. 3. The output signal from the VCO 25 includes the basic component of 4.21 MHz ($f_{SC}+40f_H=(535/2)f_H$) and higher harmonic components of 8.42 MHz, 12.63 MHz .... Therefore, the output signal from the multiplier 16 includes no spurious component in the vicinity of the frequency $40f_H$. Thus, the output signal from the LPF 17 has no spurious component, so that picture quality during reproducing can be greatly improved.

(iii) There is no need to create a signal which is synchronous with the horizontal synchronizing signal as in the conventional case. Thus, the circuit structure is simplified similarly to the item (i). Further, spurious components of a relatively low frequency range generated in the signal processing system for creating the above signal are removed and no influence is exerted by skipping of a horizontal synchronizing signal etc., whereby a stable low-frequency conversion chrominance signal can be obtained in high accuracy.

(iv) Even if the frequency component of the output signal, being selected at $(5/2)f_H$ in frequency, from the first frequency divider 30 leaks into the LPF 27 of the second PLL circuit 23 to phase-modulate the output frequency of the VCO 25, the influence exerted by such phase modulation is frequency-interleaved on the screen wherein in reproduction, and is barely perceptible. A similar effect can be attained if the output signal from the first frequency divider 30 has a frequency which is an odd multiple of half of the horizontal synchronizing frequency $f_H$.

Figure 5:
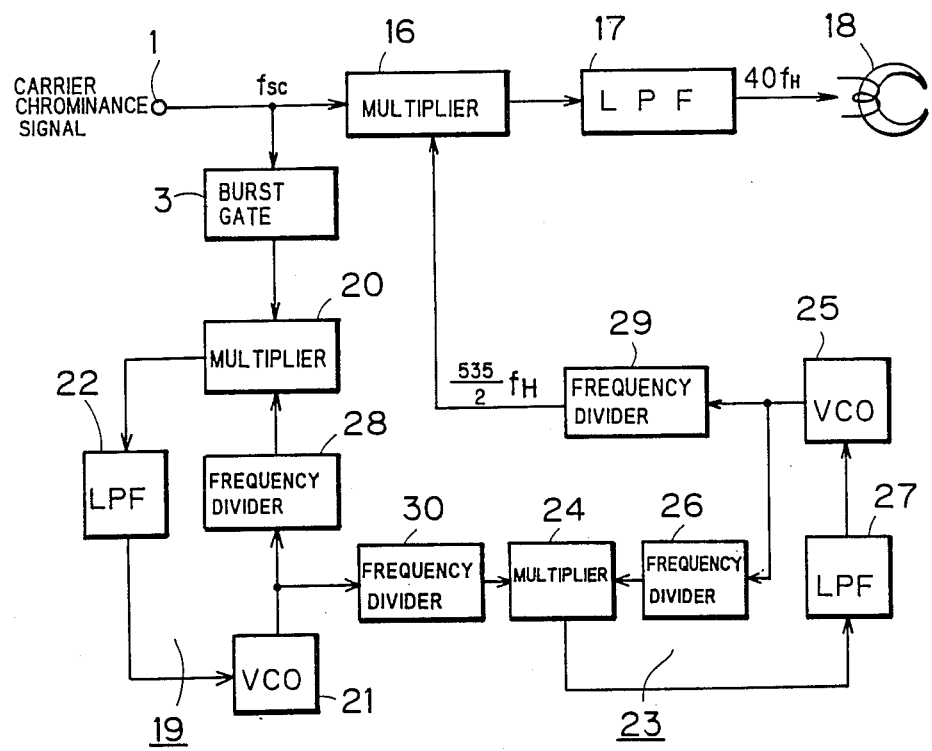
FIG. 5 is a block diagram showing another embodiment of the present invention.

FIG. 5 is a block diagram showing another embodiment of the low-frequency converter for a carrier chrominance signal according to the present invention. In this embodiment, a first PLL circuit 19, which is phase-locked to a color burst signal, is provided with a frequency divider 28 having a divisional ratio of 1/m so that a signal obtained by frequency-dividing an output signal from a VCO 21 by the frequency divider 28 is inputted in a multiplier 20 to obtain a continuous wave signal which is in phase with the color burst signal and has a frequency m times that of the color burst signal. This continuous wave signal is frequency-divided by a first frequency divider 30 and multiplied by a second PLL circuit 23, and then frequency-divided by a second frequency divider 29 provided in the next stage of the second PLL circuit 23 and thereafter supplied to a multiplier 16. When, for example, the divisional ratio of the second frequency divider 29 is selected to be identical to that of the frequency divider 28 of the first PLL circuit 19, the multiplication factor of the first PLL circuit 19 is cancelled by the divisional ratio of the second frequency divider 29. Thus, the output signal of the second frequency divider 29 has a frequency of $(535/2)f_H$, for example, assuming that the divisional ratio of the first frequency divider 30 and the multiplication factor of the second PLL circuit 23 are identical to those of the aforementioned embodiment. In general, the multiplication factors of the first and second PLL circuits 19 and 23 and the divisional ratios of the first and second frequency dividers 30 and 29 can be appropriately selected so that the output signal from the second frequency divider 29 has the frequency of $(535/2)f_H$.

The second PLL circuit 23 and the second frequency divider 29 can be omitted because the continuous wave signal which is in phase with the color burst signal and has the frequency of $(535/2)f_H$ can be created using only the first PLL circuit 19 and the first frequency divider 30. In this case, the multiplication factor of the first PLL circuit 19 may be selected as 107 and the divisional ratio of the first frequency divider 30 may be selected as 1/91, for example.

In the case of employing a crosstalk cancel system of PS or PI, a phase transition circuit may be provided between the second PLL circuit 23 and the multiplier 16 shown in FIG. 3, or between the second frequency divider 29 and the multiplier 16 shown in FIG. 5. In the embodiment illustrated in FIG. 3, the second frequency divider 29 may also serve as a phase transition circuit.

Although each of the above embodiment has been described with reference to the case of recording a color video signal of the NTSC system by a video tape recorder of the VHS system, the present invention is also applicable to a color video signal and a video tape recorder of other system, as a matter of course. Although the signal having the frequency of the sum of frequencies of the carrier chrominance signal and the low-frequency conversion chrominance signal is inputted in the multiplier 16, as the main balanced modulator, together with the carrier chrominance signal, it may be replaced by a signal based on the frequency difference.

Figure 6:
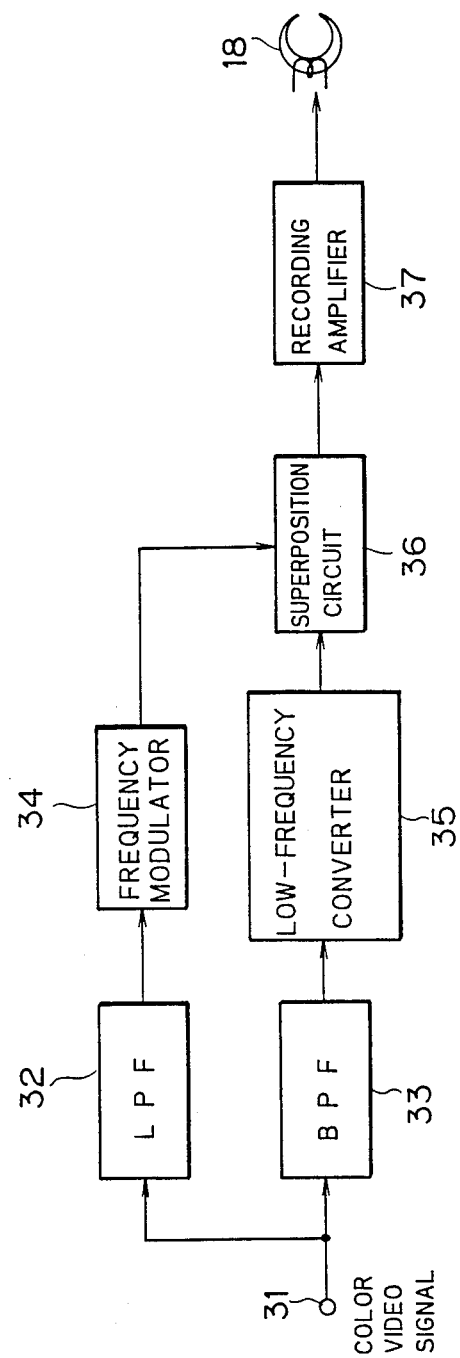
FIG. 6 is a block diagram showing a recording system in a video tape recorder.

FIG. 6 is a block diagram showing a recording system in a video tape recorder, to which the low-frequency converter according to the present invention is applied. Referring to FIG. 6, a color video signal is supplied to an input terminal 31. An LPF 32 and a BPF 33 receive the color video signal to extract a luminance signal and a carrier chrominance signal from the color video signal, respectively. The luminance signal is frequency-modulated by a frequency modulator 34, and the carrier chrominance signal is frequency-converted by a low-frequency converter 35 to be a low-frequency conversion chrominance signal. The low-frequency converter 35 may have the structure shown in FIG. 3 or FIG. 5. Output signals from the frequency modulator 34 and the low-frequency converter 35 are fed to a superposition circuit 36 to be superposed. The output signal from the superposition circuit 36 is amplified by a recording amplifier 37 to be fed to a recording head 18.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low-frequency converter for converting a carrier chrominance signal including a color burst signal to a low-frequency range in order to obtain a low-frequency conversion chrominance signal, said low-frequency converter comprising:
    input means for inputting said carrier chrominance signal;
    first extracting means connected to said input means for extracting said color burst signal from said carrier chrominance signal to output an extracted color signal;
    a first phase-locked-loop (PLL) circuit means connected to said first extracting means for receiving said extracted color burst signal and being phase-locked to said extracted color burst signal wherein the output of said first phase-locked-loop circuit means is a first continuous wave signal having a frequency which is an integral number of the frequency of said color burst signal;
    frequency conversion means including at least a first frequency divider connected to said PLL circuit for frequency-dividing said first continuous wave signal and for frequency-converting said first continuous wave signal and outputting a second continuous wave signal having a frequency equal to one of the sum and the difference of said carrier chrominance signal and said low-frequency conversion chrominance signal;
    a multiplier means connected to said input means and said frequency conversion means for receiving at its input said carrier chrominance signal and said second continuous wave signal and multiplying said carrier chrominance signal by said second continuous wave signal to provide a multiplied output signal; and
    second extracting means connected to said multiplier means for extracting said low-frequency conversion chrominance signal from said output signal of said multiplier means.

2. A low frequency converter for a carrier chrominance signal in accordance with claim 1, wherein
    said frequency conversion means further includes a second phase-locked-loop circuit which is phase-locked to an output signal from said first frequency divider in order to multiply said output signal from said first frequency divider by a predetermined value.

3. A low-frequency converter for a carrier chrominance signal in accordance with claim 2, wherein
    said frequency conversion means further includes a second frequency divider for frequency-dividing an output signal from said second phase-locked-loop circuit.

4. A low-frequency converter for a carrier chrominance signal in accordance with claim 2, wherein
    said carrier chrominance signal is in the NTSC system,
    said first continuous wave signal outputted from said first phase-locked-loop circuit is identical in frequency to said color burst signal,
    said first frequency divider has a divisional ratio of 1/91, and
    said second phase-locked-loop circuit has a multiplication factor of 107.

5. A low-frequency converter for a carrier chrominance signal in accordance with claim 2, wherein
    said carrier chrominance signal is included in a color video signal which includes a horizontal synchronizing signal, and
    said output signal from said first frequency divider is selected to be a frequency which is an odd multiple of half of the frequency of said horizontal synchronizing signal.

6. A video tape recorder system for recording a color video signal, which includes a carrier chrominance signal including a color burst signal, on a magnetic tape, wherein said system has a low-frequency converter for converting said carrier chrominance signal in said color video signal to obtain a low frequency conversion chrominance signal, comprising:
    input means for inputting said color video signal;
    separation means connected to said input means for separating said carrier chrominance signal from said color video signal;
    first extracting means connected to said separation means for extracting said color burst signal from said carrier chrominance signal to output an extracted color burst signal;
    a first phase-locked-loop (PLL) circuit means connected to said first extracting means for receiving said extracted color burst signal and being phase-locked to said extracted color burst signal wherein the output of said first phase-locked-loop circuit means is a first continuous wave signal having a frequency which is an integral number of the frequency of said color burst signal;
    frequency conversion means including at least a first frequency divider connected to said PLL circuit for frequency-dividing said first continuous wave signal and for frequency-converting said first continuous wave signal and outputting a second continuous wave signal having a frequency equal to one of the sum and the difference of said carrier chrominance signal and said low-frequency conversion chrominance signal;
    a multiplier means connected to said separation means and said frequency conversion means for receiving at its input said carrier chrominance signal and said second continuous wave signal and multiplying said carrier chrominance signal by said second continuous wave signal to provide a multiplied output signal; and
    second extracting means connected to said multiplier means for extracting said low-frequency conversion chrominance signal from said output signal of said multiplier means.

7. A video tape recorder in accordance with claim 6, wherein
    said frequency conversion means further includes a second phase-locked-loop (PLL) circuit which is phase-locked to an output signal from said first frequency divider in order to multiply said output signal from said first frequency divider by a predetermined value.

8. A video tape recorder in accordance with claim 7, wherein
said frequency conversion means further includes a second frequency divider for frequency-dividing an output signal from said second PLL circuit.

9. A video tape recorder in accordance with claim 7, wherein
said carrier chrominance signal is in the NTSC system, said first continuous wave signal outputted from said first PLL circuit is identical in frequency to said color burst signal,
said first frequency divider has a divisional ratio of 1/91, and
said second PLL circuit has a multiplication factor of 107.

10. A video tape recorder in accordance with claim 7, wherein
said color video signal further includes a horizontal synchronizing signal, and
said output signal from said first frequency divider has a frequency which is an odd multiple of half of the frequency of said horizontal synchronizing signal.

* * * * *